(12) United States Patent
Watanabe et al.

(10) Patent No.: US 7,722,164 B2
(45) Date of Patent: May 25, 2010

(54) PIEZOELECTRIC ACTUATOR, METHOD OF MANUFACTURING THE SAME, AND INKJET RECORDING HEAD

(75) Inventors: Hidetoshi Watanabe, Tokoname (JP); Takayuki Yamamoto, Kirishima (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 748 days.

(21) Appl. No.: 11/536,097

(22) Filed: Sep. 28, 2006

(65) Prior Publication Data

US 2007/0076061 A1 Apr. 5, 2007

(30) Foreign Application Priority Data

Sep. 28, 2005 (JP) ............... 2005-281383

(51) Int. Cl.
*B41J 2/045* (2006.01)
*B41J 2/14* (2006.01)
*H01L 41/00* (2006.01)

(52) U.S. Cl. .............. 347/70; 347/50; 310/365
(58) Field of Classification Search .......... 347/50, 347/58, 68–72; 310/364–366
See application file for complete search history.

(56) References Cited

U.S. PATENT DOCUMENTS 5,360,943 A * 11/1994 Mori et al. ........... 174/84 R 7,255,428 B2 * 8/2007 Hara .................. 347/70
2004/0183867 A1 9/2004 Hirota

FOREIGN PATENT DOCUMENTS

| EP | 1459898 A2 | 9/2004 |
|----|------------|--------|
| JP | H09-300632 A | 11/1997 |
| JP | 1999343313 A | 2/1999 |
| JP | 2004-260028 A | 9/2004 |
| JP | 2004-304025 A | 10/2004 |
| JP | 2005-039178 A | 2/2005 |
| JP | 2005-074722 A | 3/2005 |

OTHER PUBLICATIONS

European Patent Office, European Search Report for Related Application No. 06020414.6 dated Jan. 24, 2007.
The State Intellectual Property Office of the People's Republic of China, Notification of First Office Action, dated Jun. 27, 2008. (Counterpart of above-captioned Patent Application).

* cited by examiner

*Primary Examiner*—Stephen Meier
*Assistant Examiner*—Geoffrey Mruk
(74) *Attorney, Agent, or Firm*—Baker Botts L.L.P.

(57) ABSTRACT

A piezoelectric actuator that includes plural individual electrodes each of which includes a driving electrode and a connection terminal disposed at one end of the driving electrode. A maximum difference in height between the connection terminals is 4 μm or less.

8 Claims, 3 Drawing Sheets

PIEZOELECTRIC ACTUATOR, METHOD OF MANUFACTURING THE SAME, AND INKJET RECORDING HEAD

CROSS REFERENCE TO RELATED APPLICATION

This application claims priority from Japanese Patent Application No. 2005-281383, filed on Sep. 28, 2005, the entire subject matter of which is incorporated herein by reference.

TECHNICAL FIELD

Aspects of the present invention relate to a piezoelectric actuator, a method of manufacturing the piezoelectric actuator, and an inkjet recording head, and more particularly, to a laminated piezoelectric actuator for positioning a variety of devices or for pressurizing by generating a minute displacement, a method of manufacturing the piezoelectric actuator, and an inkjet recording head having the piezoelectric actuator.

BACKGROUND

Related examples of a product employing piezoelectric ceramics include a piezoelectric actuator, a filter, a piezoelectric resonator (including oscillator), an ultrasonic vibrator, an ultrasonic motor, and a piezoelectric sensor. Among these products, since the piezoelectric actuator has a very high response speed, which is about $10^{-6}$ second, to an electrical signal, the piezoelectric actuator is used as a piezoelectric actuator for positioning an XY stage of a semiconductor manufacturing apparatus and as a piezoelectric actuator for an inkjet recording head of an inkjet printer.

On the other hand, with the increase in dot density of an inkjet recording head, it is necessary to arrange a piezoelectric actuator used for the inkjet recording head with a high density. Accordingly, there has been suggested a piezoelectric actuator in which individual electrodes are arranged in a matrix on the surface of a piezoelectric body (for example, see JP-A-11-34313).

FIG. 3A is a plan view illustrating a related inkjet recording head which includes the piezoelectric actuator disclosed in JP-A-11-34313, and FIG. 3B is a cross-sectional view taken along Line III-III of FIG. 3A. As shown in the figures, an inkjet recording head 70 used in the inkjet recording apparatus and employing a piezoelectric method has a structure such that a piezoelectric actuator 61 is disposed on a flow channel member 53 in which a plurality of grooves are formed as ink pressurizing chambers 53a and partition walls 53b are formed as walls for partitioning the ink pressurizing chambers 53a.

In the piezoelectric actuator 61, a piezoelectric ceramic layer 65 and individual electrodes 66 are stacked in this order on a vibrating plate 62 in which a common electrode 64 is formed on a top surface thereof. The individual electrodes 66 are plurally arranged on the surface of the piezoelectric ceramic layer 65, thereby forming a plurality of displacement elements 67. The piezoelectric actuator 61 is attached to the flow channel member 53 so that the ink pressurizing chambers 53a correspond to the individual electrodes 66.

In the inkjet recording head 70, ink in the ink pressurizing chambers 53a is pressurized by applying a driving voltage across the common electrode 64 and the individual electrodes 66 and thus vibrating the displacement elements 67, thereby ejecting ink droplets from ink ejecting holes 58 opened in the bottom surface of the flow channel member 53.

In addition, by constructing the inkjet recording head 70 (piezoelectric actuator 61) so that the individual electrodes 66 are arranged on the piezoelectric ceramic layer with a constant pitch to dispose the plurality of displacement elements 67 and to independently control the displacement elements 67, it is possible to contribute to increase in speed and precision of an inkjet printer.

Each individual electrode 66 includes a driving electrode 66a contributing to displacement of the displacement elements 67 and a connection terminal (land) 66b for applying a driving voltage. An external circuit board (not shown) for applying the driving voltage is electrically connected to the connection terminals 66b by means of soldering or pressing contact members.

Since the connection terminals 66b are formed outside the regions of the ink pressurizing chambers 53a, it is considered that the piezoelectric actuator 61 has an excellent deformation characteristic. Further, it is considered that the decrease in the efficiency of deformation is small and the variation of the deformation amount is small.

SUMMARY

Recently, with the increase in density of the individual electrodes 66, connection failures may occur between the individual electrodes 66 and the external circuit board.

Aspects of the invention provide a piezoelectric actuator having excellent reliability of connection between individual electrodes disposed on the surface of a piezoelectric ceramic layer and an external circuit board and a method of manufacturing the piezoelectric actuator.

Also, aspects of the invention provide a piezoelectric actuator in which individual electrodes can be disposed with a high density on the surface of a piezoelectric ceramic layer and a method of manufacturing the piezoelectric actuator.

Further, aspects of the invention provide an inkjet recording head having a small size and capable of performing printing at a high speed.

DETAILED DESCRIPTION

<General Overview>

Figure 1A:
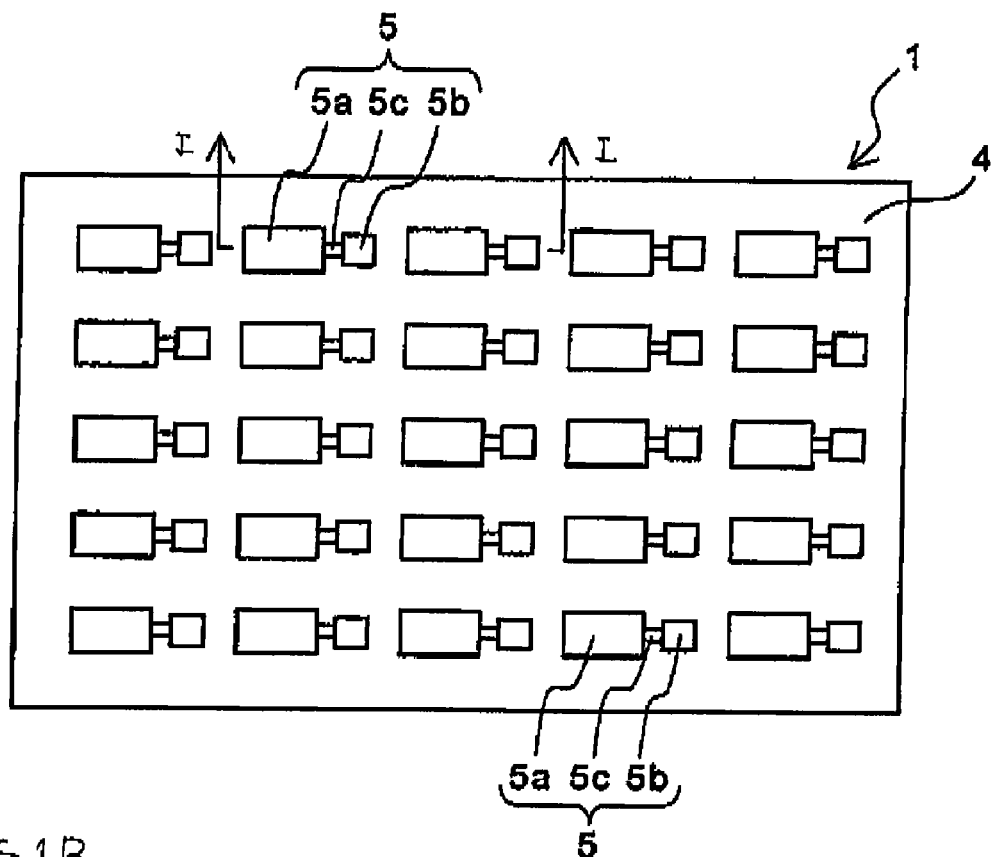
FIG. 1A is a plan view illustrating a piezoelectric actuator according to an aspect of the present invention and FIG. 1B is a cross-sectional view taken along Line I-I of FIG. 1A.

The present inventors have found out the followings. That is, when an interval between the connection terminals is relatively large, the variation in height of the connection terminals connected to the individual electrodes can be absorbed by a warp of the external circuit board disposed thereon. However, as the interval between the connection terminals decreases with the increase in density of the individual electrodes, it becomes difficult to sufficiently warp the external circuit board between the connection terminals. Accordingly, when the variation in height of the connection terminals is large, the connection failure nay occur between the connection terminals and the circuit board.

Therefore, by setting the maximum difference in height between the connection terminals of the individual is electrodes to a predetermined value or less, the reliability of connection between the connection terminals and the external circuit board is enhanced, and the density growth of the individual electrodes is reliably achieved.

According to a first aspect of the invention, there is provided a piezoelectric actuator including: a vibrating plate; common electrode formed on the vibrating plate; a piezoelectric ceramic layer formed on the common electrode; and a plurality of individual electrodes formed on a surface of the piezoelectric ceramic layer, each individual electrode forming a displacement element that is displaced by applying a driving voltage to the individual electrode, wherein each individual electrode comprises: a driving electrode that displaces the corresponding displacement element; and a connection terminal disposed at one end of the driving electrode, and wherein a maximum difference in height between the connection terminals is 4 mm or less.

According to a second aspect of the invention, the plurality of individual electrodes are arranged on the surface of the piezoelectric ceramic layer with a density of 50 to 200 per 1 $cm^2$.

According to a third aspect of the invention, the piezoelectric actuator further comprises a connecting layer is formed between the connection terminals and an external circuit board, wherein the connecting layer comprises an anisotropic conductive material.

According to a fourth aspect of the invention, the anisotropic conductive material comprises an anisotropic conductive resin paste (ACP) or an anisotropic conductive film (ACF), According to a fifth aspect of the invention, the average particle diameter of conductive particles contained in the anisotropic conductive material is 20 μm or less.

According to a sixth aspect of the invention, a method of manufacturing a piezoelectric actuator comprises: forming a common electrode on a vibrating plate; forming a piezoelectric ceramic layer on the common electrode; forming a plurality of individual electrodes each of which comprising a driving electrode and a connection terminal are formed on a surface of the piezoelectric ceramic layer; and performing a planarization process on the surface of the connection terminals so that the maximum difference in height between the connection terminals is made 4 μm or less.

According to a seventh aspect of the invention, the planarization process comprises at least one of a cutting process, a leveling process using pressurization, and a polishing process.

According to an eighth aspect of the invention, the method further comprises: disposing an external circuit board on the surfaces of the connection terminals with an anisotropic conductive material interposed therebetween after the planarization process; and curing the anisotropic conductive material so as to form a connecting layer between the connection terminals and the external circuit board.

According to a ninth aspect of the invention, the anisotropic conductive material comprises an anisotropic conductive paste (ACP) or an anisotropic conductive film (ACF).

According to a tenth aspect of the invention, there is provided an inkjet recording head comprising: the piezoelectric actuator according to the first aspect of the invention; and a flow channel member comprising a plurality of ink pressurizing chambers, wherein the piezoelectric actuator is attached onto the flow channel member so that the ink pressurizing chambers and the individual electrodes are positioned with each other, and wherein a volumes of the ink pressurizing chambers are varied by applying the driving voltage to the individual electrodes of the piezoelectric actuator.

According to the aspects of the invention, since the maximum difference in height between the connection terminals of the individual electrodes is 4 μm or less, even when the individual electrodes are arranged on the surface of the piezoelectric ceramic layer with a high density, it is possible to reduce the connection failure between the connection terminals and the external circuit board and to provide a piezoelectric actuator with high reliability of connection and excellent quality.

Accordingly, in the piezoelectric actuator according to the aspects of the invention, it is possible to arrange the individual electrodes on the surface of the piezoelectric ceramic layer with a high density and to enhance the reliability of connection between the individual electrodes and the external circuit board. Thus, the inkjet recording head according to the aspect of the invention having such piezoelectric actuator is made small and can perform printing at a high speed.

<Piezoelectric Actuator>

Figure 1B:
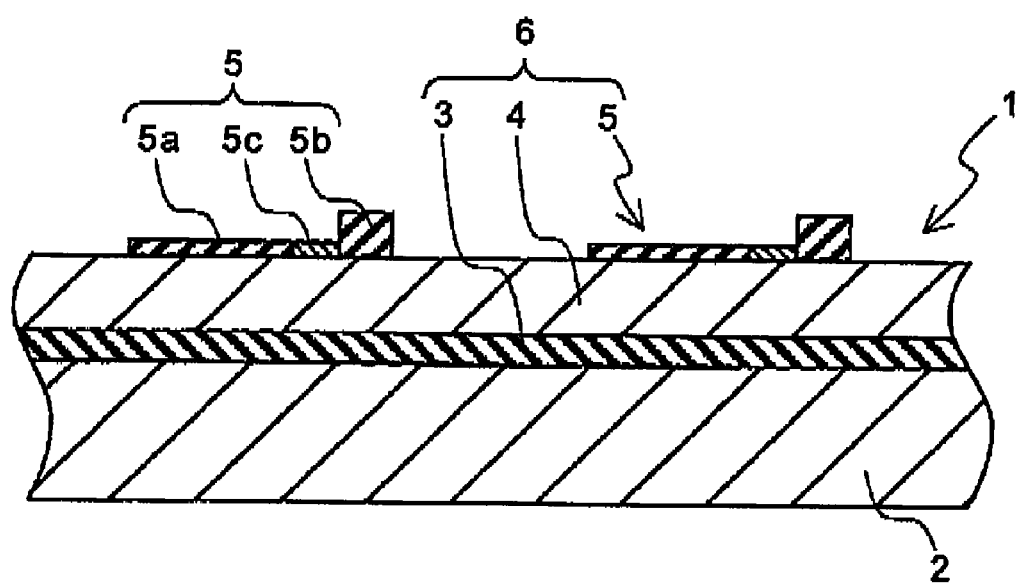

Hereinafter, a piezoelectric actuator according to an aspect of the invention will be described in detail with reference to the drawings. FIG. 1A is a plan view illustrating a piezoelectric actuator according to an aspect of the present invention and FIG. 1B is a cross-sectional view taken along Line I-I of FIG. 1A. As shown in the figures, the piezoelectric actuator 1 according to this aspect includes a vibrating plate 2, a common electrode 3, a piezoelectric ceramic layer 4, and individual electrodes 5, in which the common electrode 3, the piezoelectric ceramic layer 4, and the individual electrodes 5 are stacked on the vibrating plate 2 in this order. The vibrating plate 2 and the piezoelectric ceramic layer 4 are sheet-shaped members and have substantially the same shape and size as seen in the plan view.

The common electrode 3 and the individual electrodes 5 constitute electrodes of the piezoelectric actuator 1 and the individual electrodes 5 are plurally formed on the surface of the piezoelectric ceramic layer 4. Accordingly, a plurality of displacement elements 6 in which the common electrode 3 and the corresponding individual electrode 5 are disposed with the piezoelectric ceramic layer 4 therebetween are arranged on the vibrating plate 2. In this way, a plurality of displacement elements 6 is formed in the sheet-shaped piezoelectric actuator 1 on the basis of the positions of the individual electrodes 5. Here, the vibrating plate 2 and the piezoelectric ceramic layer 4 are both formed in a single layer, but may be formed in a laminated body of a plurality of layers so that the thickness adjustment can be easily performed A polarizing method required for displacing the piezoelectric actuator 1 is carried out depending on a displacement type required for the piezoelectric actuator 1. In order to allow the piezoelectric actuator 1 to function as a unimorph type actuator, at least portions of the piezoelectric ceramic layer 4 interposed between the common electrode 3 and the individual electrodes 5 are polarized in the stacked direction of the layers.

Each individual electrode 5 includes a driving electrode 5a contributing to the displacement of the corresponding displacement element 6, a connection terminal 5b connected to an external circuit board, and a connection portion 5c for electrically connecting the driving electrode 5a and the connection terminal 5b to each other. The individual electrodes 5 are connected to the external circuit board through the connection terminals 5b, respectively. When a voltage is applied across the electrodes (the common electrode 3 and the individual electrodes 5), portions of the piezoelectric ceramic layer 4 interposed between the common electrode 3 and the individual electrodes 5 to which the voltage has been applied are displaced. In the displacement element 6 (piezoelectric actuator 1), since the vibrating plate 2 on which the piezoelectric ceramic layer 4 is stacked regulates the displacement of the piezoelectric ceramic layer 4, (more specifically, the displacement in an in-plane direction (direction perpendicular to the stacked direction of the layers)), the portions of the displacement elements 6 to which the voltage is applied are bent in the stacked direction as a whole. In this way, the piezoelectric actuator 1 serves as a unimorph type actuator.

The height of the piezoelectric actuator 1 is not particularly limited, but is preferably 100 μm or less. By setting the thickness small, large displacement can be obtained, thereby embodying a high-efficiency driving operation with a low voltage. Specifically, in order to sufficiently exhibit a characteristic of the piezoelectric actuator 1, the height of the piezoelectric actuator is preferably 80 μm or less, more preferably 65 μm or less, and still more preferably 50 μm or less. On the other hand, in order to give a sufficient mechanical strength to the piezoelectric actuator and to prevent destruction of the piezoelectric actuator during handling and operation thereof, the lower limit of the height is preferably 3 μm, more preferably 5 μm and still more preferably 10 μm, and still more preferably 20 μm.

(Piezoelectric Ceramic Layer)

The piezoelectric ceramic layer 4 can be formed of ceramics having a piezoelectric property and examples thereof include Bi layered compound (layered perovskite compound), tungsten-bronze compound, Nb perovskite compound (alkali niobate compound (NAC) such as sodium niobate, niobic alkali earth compound (NAEC) such as barium niobate, an the like), potassium lead niobate (PMN), nickel lead niobate (PNN), lead zirconate titanate (PZT) containing Pb, and materials containing perovskite compound such as lead titanate.

Among the compounds described above, the perovskite compound containing at least Pb is particularly preferable. For example, potassium lead niobate (PMN), nickel lead niobate (PNN), lead zirconate titanate (PZT) containing Pb, and materials containing perovskite compound such as lead titanate are preferable. Specifically, crystals containing Pb as a constituent element of A site and Zr and Ti as constituent elements of B site are preferable. By using this composition, a piezoelectric ceramic layer having a high piezoelectric constant is obtained. The lead zirconate titanate (PZT) or lead titanate is suitable for resulting in a large displacement. An example of a perovskite crystal can include $PbZrTiO_3$.

Other oxides may be mixed into the piezoelectric ceramics and other elements may be replaced as secondary components for A site and/or B site. For example, it may be a solid solution of $Pb(Zn_{1/3}Sb_{2/3})O_3$ and $Pb(Ni_{1/2}Te_{1/2})O_3$ to which Zn, Sb, Ni, and Te are added as secondary components, so long as the characteristic is not affected badly.

(Vibrating Plate)

The material of the vibrating plate 2 preferably has a high insulating property, piezoelectric ceramics can be more preferably used, and substantially the same material as the piezoelectric ceramic layer 4 can be still more preferably used. When the piezoelectric actuator 1 is used in an inkjet recording head, a material having an ink resistance such as a corrosion resistance and a water resistance to the ink in use can be preferably used. Accordingly, at the time of simultaneously sintering to manufacture the vibrating plate 2 and the piezoelectric ceramic layer 4, sintering contraction in the piezoelectric actuator 1 can be uniformalized, thereby suppressing the warping deformation. The height of the piezoelectric ceramic layer 4 and the vibrating plate 2 is preferably in the range of 5 to 50 μm and more preferably in the range of 10 to 30 μm.

(Common Electrode)

The material of the common electrode 3 is not particularly limited so long as it is conductive and examples thereof include Au, Ag, Pd, Pt, Cu, Al, and alloys thereof. A specific example thereof is Ag—Pd alloy. The height of the common electrode 3 is set to maintain its conductivity and not to prevent the displacement, preferably in the range of 0.5 to 5 μm, and more preferably in the range of 1 to 4 μm.

(Individual Electrode)

Similarly to the common electrode described above, the materials of the driving electrodes 5a, the connection terminals 5b, and the connection portions 5c of the individual electrodes 5 are not particularly limited so long as they have a conductivity and examples thereof include Au, Ag, Pd, Pt, Cu, Al, and alloys thereof. Au can be used preferably for the driving electrodes 5a and Ag can be used preferably for the connection terminals 5b.

The height of the driving electrodes 5a is set to maintain the conductivity and not to prevent the displacement, preferably in the range of 0.1 to 2 μm, more preferably in the range of 0.1 to 0.5 μm, and still more preferably in the range of 0.1 to 0.3 μm. The height of the connection terminals 5b is 5 μm or more and preferably in the range of 5 to 15 μm so as to enhance the reliability of connection to the external circuit board. The height of the connection portion 5c is preferably in the range of 1 to 10 μm in view of the reliability of connection between the driving electrodes 5a and the connection terminals 5b.

The maximum difference in height between the connection terminals 5b is 4 μm or less. The maximum difference in height can be calculated as described later, by measuring the heights of the connection terminals with a laser displacement system, selecting the maximum height and the minimum height from the measured heights, and then calculating the difference therebetween. Here, when the difference in height between the connection terminals 5b is great (for example, greater than 4 μm) and are connected to the external circuit board, distortion corresponding to the difference in height between the connection terminals is generated. This is because the piezoelectric actuator 1 and the external circuit board are members having rigidity. Depending upon the size in distortion, unnecessary stress acts on the adjacent displacement element 6, thereby varying the displacement characteristic of the piezoelectric actuator 1 or damaging the connection portions between the external circuit board and the connection terminals 5b. In order to avoid such a problem, it is ideal that all the connection terminals 5b have the same height, but the difference in height may be about 4 μm in maximum.

According to the above configuration, the reliability of connection between the individual electrodes 5 and the external circuit board can be enhanced, thereby arranging the individual electrodes 5 on the surface of the piezoelectric ceramic layer 4 with a high density. Here, the "high density" means that the individual electrodes 5 are arranged on the surface of the piezoelectric ceramic layer 4 with a density of 50 to 200 per 1 $cm^2$. On the other hand, when the maximum difference is greater than 4 μm, the reliability of connection between the individual electrodes 5 and the external circuit board is lowered. Accordingly, it is not possible to arrange the individual electrodes 5 with the high density.

(Connecting Layer)

The connection terminals 5b and the external circuit board can be connected to each other by the use of conductive particles in an anisotropic conductive resin paste (ACP) or an anisotropic conductive film (ACF), as well as by the use of a soldering process. In this aspect, the bonding using the ACP or the ACF is preferable, since the bonding process can be performed at a low temperature and thus it is possible to prevent deterioration in characteristic of the piezoelectric body (piezoelectric ceramic layer 4) due to heat. Here, the anisotropic conductive resin paste (ACP) means that anisotropic conductive resin is in a paste state and the anisotropic conductive film (ACF) means that the anisotropic conductive resin is in a film state. The anisotropic conductive resin means resin having a high conductivity in the thickness direction and a high insulating property in the in-plane direction. For example, thermosetting resin in which conductive particles are dispersed such as acryl resin or epoxy resin of acid anhydride curable type, phenol curable type, and amine curable type can be exemplified. Examples of the conductive particles include metal particles such as gold, silver, and nickel or resin particles of which the surface have been plated with gold.

Synthetic rubber or thermosetting resin can be used as the resin material in which the conductive particles are dispersed, so long as heat resistance is not required. Any resin material can serve as an adhesive for mechanically fixing the connection portions. In this aspect, in consideration of heating at the time of re-polarizing the piezoelectric actuator 1, the epoxy resin having heat resistance is employed.

When the connecting layer composed of the ACP or ACF is formed between the connection terminals 5b and the external circuit board, conductive particles having small particle diameters can be contained in the ACP or ACF. This is because the maximum difference in height between the connection terminals 5b is 4 µm or less, which is small. Due to this, even when the area of the connection terminals 5b is decreased with the increase in density, the sufficient number of conductive particles can be secured, thereby not damaging the reliability of connection. Specifically, the average particle diameter of the conductive particles is preferably 20 µm or less, more preferable in the range of 3 to 20 µm, and still more preferable in the range of 5 to 15 µm. The average particle diameter is a value obtained by measuring the diameters of the conductive particles by the use of a grain size distribution measuring machine.

The content of the conductive particles in the thermosetting resin is preferably in the range of 1 to 25 mass %, and the height of the connecting layer is preferably in the range of 3 to 20 µm and more preferably in the range of 5 to 15 µm. The height of the anisotropic conductive film (ACF) is equal to the height of the connecting layer.

<Method of Manufacturing Piezoelectric Actuator>

Next, a method of manufacturing a piezoelectric actuator will be described.

(First Process)

First, piezoelectric ceramics raw powders which are the materials of the piezoelectric ceramic layer 4 and the vibration plate 2 are prepared. The average particle diameter of the piezoelectric ceramics raw powders is preferably 1 µm or less, more preferably 0.7 µm or less, and still more preferably 0.6 µm or less. By setting the average particle diameter of the piezoelectric ceramics raw powders to 1 µm or less, uniform sintering contraction at the time of sintering is obtained, thereby obtaining the piezoelectric ceramic layer 4 and the vibrating plate 2 which are homogeneous. The piezoelectric ceramics raw powders are mixed with an organic binder component, thereby preparing a sheet-forming slurry. Next, a necessary number of ceramic green sheets are manufactured by the use of a general sheet shaping method such as a roll coater method, a slit coater method, and a doctor blade method using the sheet-forming slurry.

Next, the ceramic green sheet obtained as described above is pressurized as needed. By pressurizing the ceramic green sheet after forming the sheet, the density of the sheet can be increased, thereby reducing the deviation in height or density. As the pressurizing method, known methods can be employed, but a roll pressurizing method, a plane pressurizing method, a hydrostatic pressurizing method, or the like can be preferably employed because it is easy to make the height uniform. The pressurizing pressure is different depending on the composition of materials, the amount of organic binder, and the height of green sheet, but is preferably in the range of 10 to 100 MPa, more preferably in the range of 20 to 50 MPa, still more preferably in the range of 30 to 40 MPa. When the variation in height of the green sheets obtained by the pressurizing process is 15% or less, particularly 10% or less, the variation in height of the piezoelectric ceramic layer 4 and the vibration plate 2 formed after the backing process can be reduced and the warping deformation can be prevented.

(Second Process)

Next, common electrode paste containing the electrode materials exemplified for the common electrode is prepared. The common electrode paste includes components of organic vehicles such as ethyl cellulose, in addition to the electrode material (Au, Ag, and the like). The electrode paste for the common electrode 3 is printed on one surface of the green sheet which becomes the vibrating plate 2 by sintering among the ceramic green sheets manufactured above by the use of a screen printing method. In this case, it is preferable that the height is in the range of 1 to 3 µm and the deviation in height (difference between the maximum and the minimum) is in the range of 0.5 to 1.5 µm. Via holes may be formed in a part of the green sheets and via conductors may be inserted into the via holes, as needed.

(Third Process)

The ceramic green sheets manufactured in the first process and the second process are laminated and brought into close contact with each other, thereby manufacturing a laminated body. Examples of the close contact method can include a method using a close contact solution including an adhesive component, a close contact method of giving an adhesive property to the organic binder component in the green sheets by heating, and a close contact method using only a pressurizing process.

(Fourth Process)

The laminated body obtained in the third process is defatted to remove the organic component from the laminated body and then is sintered at a temperature of 900 to 1200° C. in the atmosphere of oxygen (with a high concentration), thereby obtaining a piezoelectric actuator. In the fourth process (sintering process), it is preferable that the sintering process is performed in the state that the laminated bodies obtained in the third process are stacked in a plurality of steps with a sample base plate made of zirconia or magnesia interposed therebetween and a weight is placed on the laminated bodies stacked in steps. By employing such a method, the warping deformation of the piezoelectric actuator body can be suppressed, thereby providing a piezoelectric actuator formed of a laminated sintered body having a height of 100 µm or less.

(Fifth Process)

By printing patterns of the driving electrodes 5a and patterns of the connection portions 5c on the surface of the piezoelectric actuator body obtained in the fourth process by the use of a screen printing method, performing a sintering process at a temperature of 500 to 800° C. and preferably at a temperature of 650 to 800° C., printing patterns of the connection terminals 5b in the same way as the patterns of the driving electrodes 5a and the patterns of the connection portions 5c, and then performing the sintering process again at a temperature of 500 to 800° C. and preferably at a temperature of 650 to 80020 C., the individual electrodes 5 are formed. Here, as the respective electrode paste for the driving electrodes 5a, the connection terminals 5b, and the connection portions 5c, paste containing the electrode materials exemplified for the individual electrodes as a major component can be used.

The patterns of the connection portions 5c, may be printed in the process of printing the patterns of the connection terminals 5b, as well as in the process of printing the patterns of the driving electrodes 5a. By performing the printing of the patterns of the connection terminals 5b plural times, the connection terminals 5b may have a height larger than that of the driving electrodes 5b and the connection portions 5c. By printing the is patterns of the connection terminals 5b at the time of printing the patterns of the driving electrodes 5a and the patterns of the connection portions 5c, performing the sintering process, printing again the patterns of the connection terminals 5b on the patterns of the connection terminals 5b, and then performing the sintering process, the formed connection terminals 5b may have a height larger than that of the driving electrodes 5a and the connection portions 5c. In this case, the number of printings is not particularly limited and the electrode paste for the connection terminals 5b may be not changed for all the printings and may be changed for each printing.

(Sixth Process)

Next, the connection terminals 5b obtained in the fifth process is subjected to a planarization process so that the maximum difference in height becomes 4 μm or less. A method of performing the planarization process is not particularly limited so long as it can make the maximum difference in height 4 μm or less. Specifically, in this aspect, at least one selected from a cutting process using a diamond bite, a leveling process of pressurizing a plate, and a polishing process using a polishing plate can be preferably used to surely make the maximum difference in height 4 μm or less with high efficiency. The cutting process, the leveling process, and the polishing process may be used singly or by combination of two or more, or for example, the cutting process and the leveling process may be sequentially performed.

(Seventh Process)

The ACP is applied to or the ACF is attached to the connection terminals 5b having been subjected to the planarization process in the sixth process, the connection terminals of the external circuit board are positioned with the connection terminals 5b, and the temperature is increased in a pressurized state to cure the adhesive (ACP or ACF), thereby forming the connecting layer formed of the ACP or the ACF between the connection terminals 5b and the external circuit board. Here, the temperature for curing the adhesive is preferably in the range of 100 to 150° C. As a result, since the temperature at the time of performing the bonding is lower than that of a bonding process using soldering, the deterioration in characteristic of the piezoelectric body (piezoelectric ceramic layer 4) due to heat is prevented. In the seventh process, the ACP or ACF serving as the connecting layer is disposed on the surface of the piezoelectric actuator body, but may be disposed in advance on the external circuit board.

<Inkjet Recording Head>

Figure 2A:
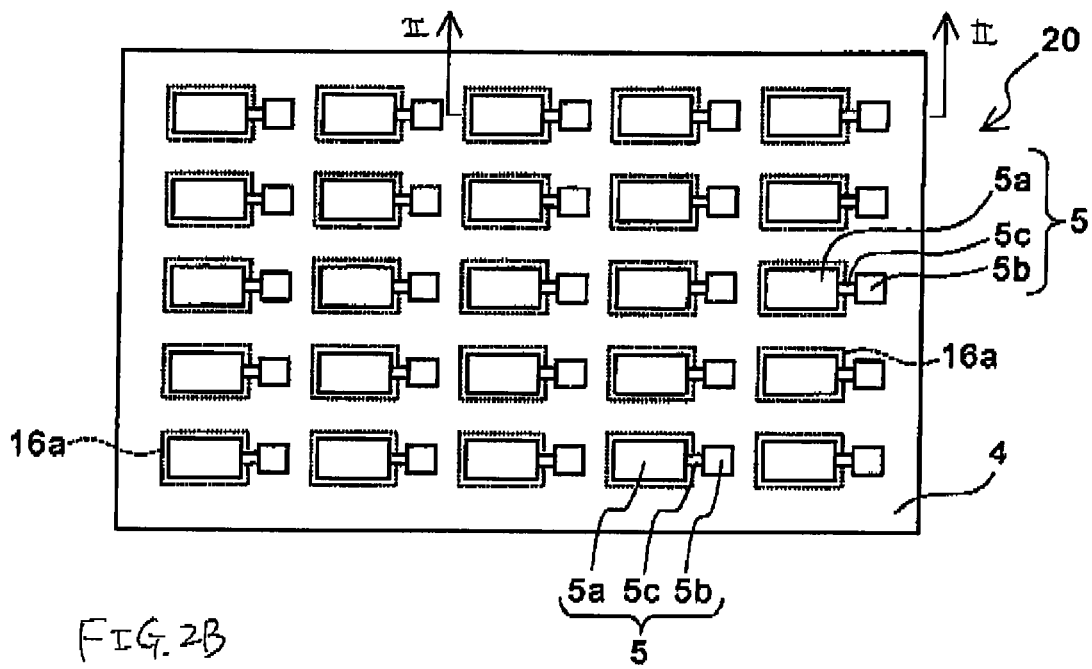
FIG. 2A is a plan view illustrating an inkjet recording head according to an aspect of the invention and FIG. 2B is a cross-sectional view taken along Line II-II of FIG. 2A.
Figure 2B:
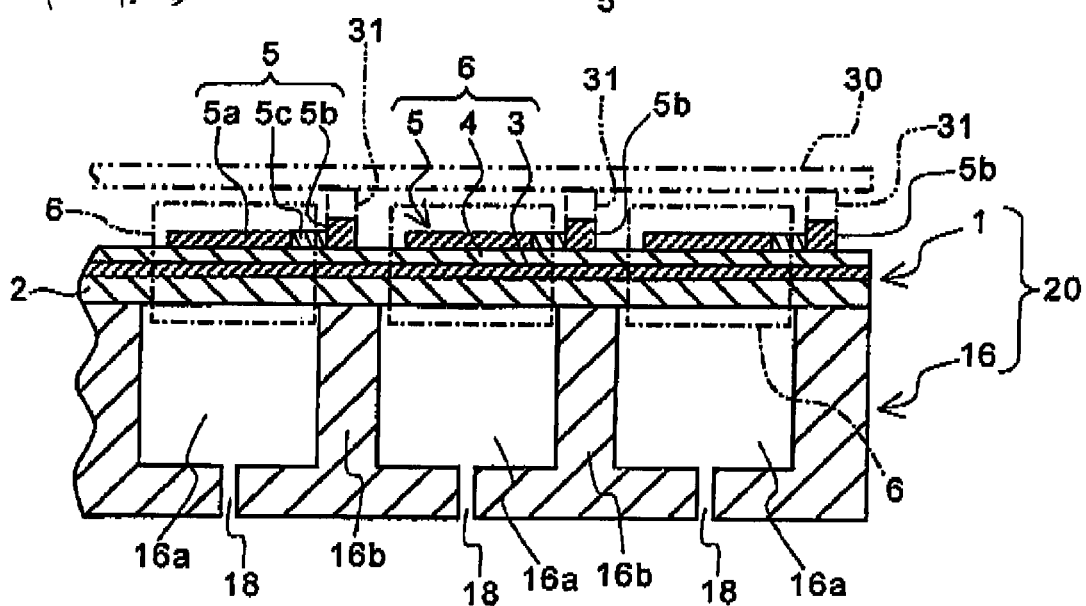
Figure 3A:
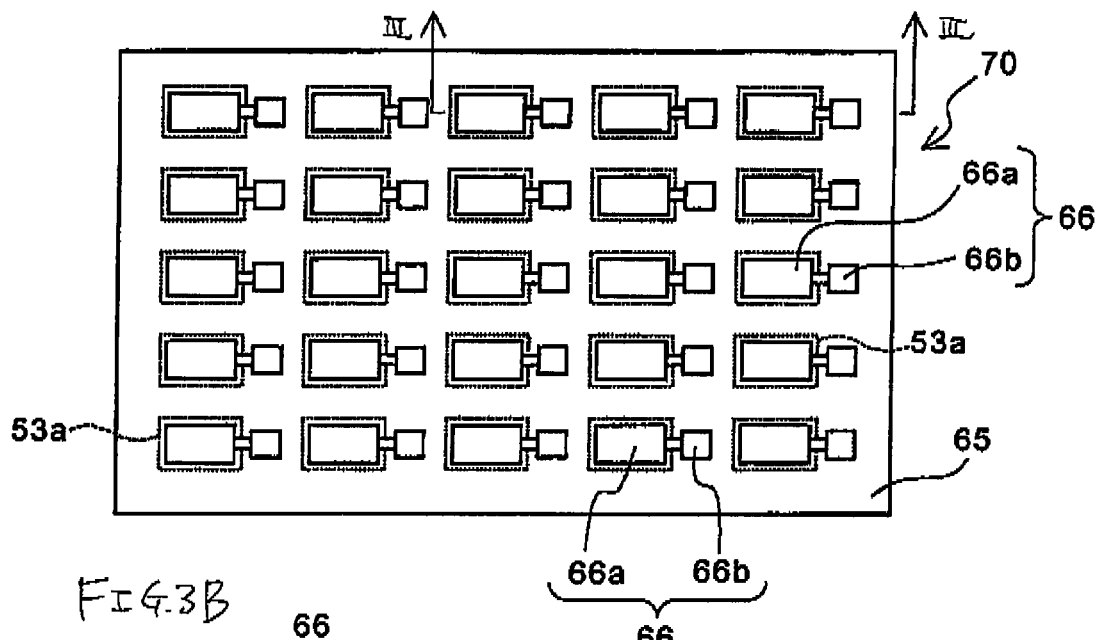
FIG. 3A is a plan view illustrating a related inkjet recording head and FIG. 3B is a cross-sectional view taken along Line III-III of FIG. 3A.
Figure 3B:
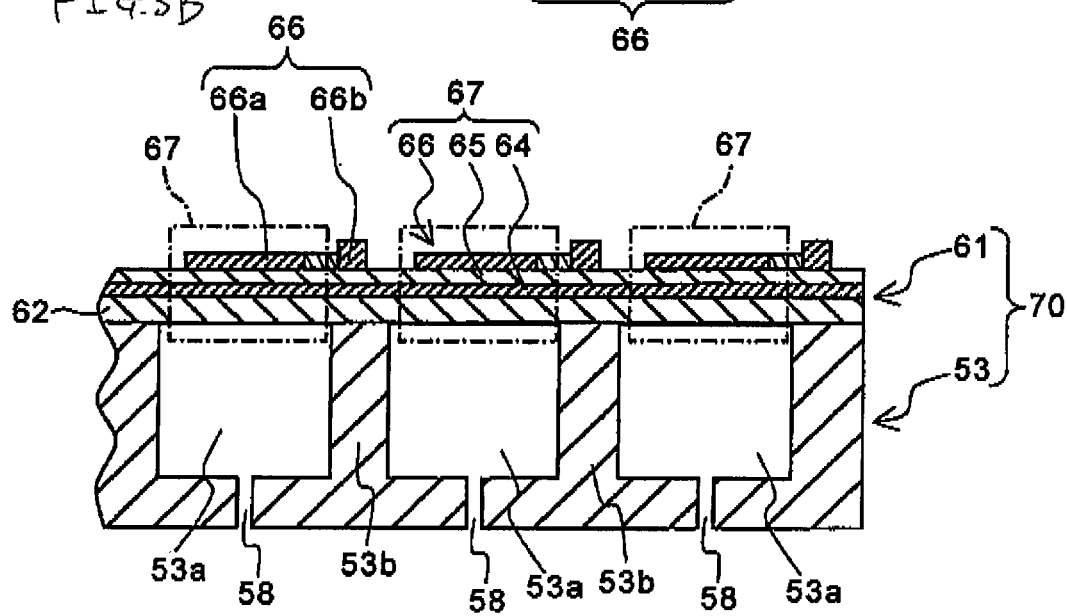

Since the piezoelectric actuator according to the aspect of the invention has a plurality of displacement elements on one substrate (vibrating plate), the piezoelectric actuator can be suitably used in an inkjet recording head for an inkjet recording apparatus. Hereinafter, an inkjet recording head having the piezoelectric actuator according to an aspect of the invention will be described. FIG. 2A is a plan view illustrating an inkjet recording head according to an aspect of the invention and FIG. 2B is a cross-sectional view taken along Line II-II of FIG. 2A. In FIGS. 2A and 2B, the elements equal or equivalent to those of FIG. 1 described above are denoted by the same reference numerals and description thereof will be omitted.

As shown in FIGS. 2A and 2B, in the inkjet recording head 20, the above-mentioned piezoelectric actuator 1 is bonded to a flow channel member 16 in which a plurality of ink pressurizing chambers 16a are formed and partition walls 16b are formed as walls for partitioning the ink pressurizing chambers 16a. The vibrating plate 2 constitutes a part of the walls of the ink pressurizing chambers 16a. A common ink channel (not shown) formed in the flow channel member 16 is connected to the ink pressurizing chambers 16a having the above-mentioned construction and external ink can be distributed and supplied from the common ink channel.

The flow channel member 16 is obtained using a rolling method and the ink ejecting holes 18 and the ink pressurizing chambers 16a are processed and formed in predetermined shapes by an etching method. The flow channel member 16 is formed preferably out of at least one selected from a group consisting of Fe—Cr alloys, Fe—Ni alloys, and Wc-Ti alloys, more preferably out of a material having an excellent corrosion resistance to the ink, and still more preferably out of the Fe—Cr alloys.

The flow channel member 16 and the piezoelectric actuator 1 can be stacked and bonded with, for example, a connecting layer therebetween, so that the vibrating plate 2 comes in contact with the space of the ink pressurizing chambers 16a. More specifically the driving electrodes 5a of the individual electrodes 5 correspond to the ink pressurizing chambers 16a, respectively, and the connection terminals 5b are located outside the regions of the ink pressurizing chambers 16a.

A variety of known ones can be employed as the connecting layer, but an adhesive of at least one kind of thermosetting resin selected from a group consisting of epoxy resin, phenol resin, and polyphenylene ether resin which do not affect the piezoelectric actuator 1 or the flow channel member 16 due to heat and which have a thermosetting temperature of 100 to 150° C. By heating the connecting layer up to the thermosetting temperature, the piezoelectric actuator 1 and the flow channel member 16 can be heated and bonded to each other. As a result, it is possible to obtain an inkjet recording head 20. Here, since the piezoelectric actuator 1 is fixed to the partition walls of the flow channel member 16 for partitioning the ink pressurizing chambers 16a, the entire displacement elements 6 are warped so as to vary the volumes of the ink pressurizing chambers at the time of vibration due to application of a voltage.

The connection terminals 5b of the inkjet recording head 20 and the external circuit board 30 for applying a driving voltage are electrically connected to each other through the anisotropic conductive resin paste (ACP) 31. When a voltage is applied across the common electrode 3 and the predetermined individual electrode 5 from the external circuit board 30, the piezoelectric ceramic layer 4 right below the individual electrode 5 to which the voltage has been applied is displaced and the ink in the ink pressurizing chamber 16a is pressurized, thereby ejecting ink droplets from the ink ejecting hole 18. The inkjet recording head 20 can eject ink droplets at a high speed with high precision and thus is suitable for a high-speed printing work.

Although the aspects of the invention have been described hitherto, the invention is not limited to the aspects, but can include changes and modifications without departing from the gist of the invention. For example, although it has been described in the aspects that each connection terminal 5b is disposed at one end of the corresponding driving electrode 5a with the corresponding connection portion 5c therebetween, the invention is not limited to it, but the connection terminal 5b may be electrically directly connected to the driving electrode 5a.

Hereinafter, aspects of the invention will be described in more details with reference to examples, but the invention is not limited to the examples.

EXAMPLES

<Manufacturing Inkjet Recording Head>

First, a piezoelectric actuator having the configuration shown in FIG. 1 was manufactured. That is, a sheet-forming slurry was prepared by mixing $PbZrTiO_3$ powders having an average particle diameter 0.5 μm with a binder and an organic solvent, and then green sheets (for the piezoelectric ceramic layer 4 and the vibrating plate 2) having a height of 15 μm were prepared by the use of a roll coater method using the obtained slurry.

On the other hand, Ag—Pd powders were mixed with a mixture ratio of Ag:Pd=7:3 in mass ratio and an organic bonding agent and a solvent were mixed in a predetermined amount, thereby obtaining common electrode paste.

Next, the green sheet on which the obtained common electrode paste was applied and the green sheet on which the obtained common electrode paste was not applied were laminated and brought into close contact with each other, thereby forming a mother laminated body. Then, the mother laminated body was cut to form a laminated body and the laminated body was sintered in the atmosphere of oxygen at a temperature of 1000° C. for two hours, thereby forming a piezoelectric actuator body.

Next, electrode paste containing Au as a major component was printed on one surface of the piezoelectric actuator body by the use of a screen printing method and then was subjected to a sintering process at a temperature of 750° C., thereby forming patterns of the driving electrodes 5a, the connection terminals 5b, and the connection portions. The electrode paste containing Ag as a major component was printed on the patterns of the connection terminals 5b by the use of the screen printing method and then was subjected to the sintering process at a temperature of 600° C., thereby forming the connection terminals 5b which become the connection terminals to the external circuit board. As a result, the height of the connection terminals 5b was greater than those of the driving electrodes 5a and the connection portions 5c. The individual electrodes 5 were arranged on the surface of the piezoelectric ceramic layer 4 with a density of 150 per 1 $cm^2$.

By rotating the diamond bite mounted on a wheel, the surface of the obtained connection terminals 5b was subjected to a cutting process to obtain the maximum difference in height shown in Table 1 and then a planarization process. The piezoelectric actuator body was bonded to the flow channel member 16 with an epoxy adhesive and then the connection terminals (lands) and the external circuit board were bonded to each other with a conductive adhesive (anisotropic conductive resin paste (ACP)) containing conductive particles having the average particle diameter of 8 μm, thereby manufacturing the inkjet recording head shown in FIG. 2 (Sample Nos. 1 to 5 in Table 1).

The "maximum value" in Table 1 means the maximum height of the connection terminals having been subjected to the planarization process, the "minimum value" means the minimum height of the connection terminals having been subjected to the planarization process, the "maximum difference in height" means a difference between the maximum value and the minimum value. The maximum value and the minimum value are values obtained by measuring the connection terminals having been subjected to the planarization process with a laser displacement system.

<Evaluation of Inkjet Recording Head>

In the obtained inkjet recording head (Sample Nos. 1 to 5 in Table 1), the reliability of connection between the individual electrodes and the external circuit board was evaluated through a temperature cycle test. The evaluation method is described below and the evaluation result is shown in Table 1.

(Evaluation Method of Temperature Cycle Test)

The samples were placed at a temperature of 0° C. for 30 minutes and at a temperature of 60° C. for 30 minutes. The number of cycles was set to 100. The capacity values of the piezoelectric bodies corresponding to the individual electrodes after 100 cycles were measured and the number of connection failures was measured. The evaluation was performed to 20 connection portions between the individual electrodes and the external circuit board.

TABLE 1

| Sample No. | Thickness of Connection Terminals (Lands) | | | Temperature Cycle Test | |
|---|---|---|---|---|---|
| | Maximum Value (μm) | Minimum Value (μm) | Maximum Difference in Height (μm) | Connection Failure (Failures/20) | Judgment |
| 1 | 12 | 10 | 2 | 0/20 | ○ |
| 2 | 13 | 10 | 3 | 0/20 | ○ |
| 3 | 13 | 9 | 4 | 0/20 | ○ |
| *4 | 15 | 10 | 5 | 1/20 | X |
| *5 | 14 | 8 | 6 | 2/20 | X |

Mark * indicates comparative examples.

As can be clearly seen from Table 1, the connection failure did not occur in Sample Nos. 1 to 3 (of which the maximum difference in height is 4 μm or less) after temperature cycle test. It can be seen from this result that a piezoelectric actuator having excellent reliability of connection between the individual electrodes and the external circuit board was obtained. On the contrary, the connection failures occurred in Sample Nos. 4 and 5 in which the maximum difference in height of the connection terminals (lands) is 5 μm or more after the temperature cycle test.

What is claimed is:

1. A piezoelectric actuator comprising:
   a vibrating plate;
   a common electrode formed on the vibrating plate;
   a piezoelectric ceramic layer formed on the common electrode; and
   a plurality of individual electrodes formed on a surface of the piezoelectric ceramic layer, each individual electrode forming a displacement element that is displaced by applying a driving voltage to the individual electrode,
wherein each individual electrode comprises:
a driving electrode that displaces the corresponding displacement element and is formed on the surface of the piezoelectric ceramic layer; and
a connection terminal disposed at one end of the driving electrode and formed on the surface of the piezoelectric ceramic layer, and
wherein a maximum difference in height between the connection terminals is 4 μm or less.

2. The piezoelectric actuator according to claim 1, wherein the plurality of individual electrodes are arranged on the surface of the piezoelectric ceramic layer with a density of 50 to 200 per 1 cm$^2$.

3. The piezoelectric actuator according to claim 1, further comprising a connecting layer between the connection terminals and an external circuit board, wherein the connecting layer comprises an anisotropic conductive material.

4. The piezoelectric actuator according to claim 3, wherein the anisotropic conductive material comprises an anisotropic conductive resin paste (ACP) or an anisotropic conductive film (ACF).

5. The piezoelectric actuator according to claim 3, wherein the average particle diameter of conductive particles contained in the anisotropic conductive material is 20 μm or less.

6. The piezoelectric actuator according to claim 1, wherein the connection terminal has a thickness of 5 μm or more.

7. An inkjet recording head comprising:
a piezoelectric actuator that comprises:
a vibrating plate;
a common electrode formed on the vibrating plate;
a piezoelectric ceramic layer formed on the common electrode; and
a plurality of individual electrodes formed on a surface of the piezoelectric ceramic layer, each individual electrode forming a displacement element that is displaced by applying a driving voltage to the individual electrode, each individual electrode comprising a driving electrode that displaces the corresponding displacement element and is formed on the surface of the piezoelectric ceramic layer, and a connection terminal disposed at one end of the driving electrode and formed on the surface of the piezoelectric ceramic layer, wherein a maximum difference in height between the connection terminals is 4 μm or less; and
a flow channel member comprising a plurality of ink pressurizing chambers,
wherein the piezoelectric actuator is attached onto the flow channel member so that the ink pressurizing chambers and the individual electrodes are positioned with each other, and
wherein volumes of the ink pressurizing chambers are varied by applying the driving voltage to the individual electrodes of the piezoelectric actuator.

8. The inkjet recording head according to claim 7, wherein the connection terminal has a thickness of 5 μm or more.

* * * * *